US009719167B2

(12) United States Patent
Gatineau et al.

(10) Patent No.: US 9,719,167 B2
(45) Date of Patent: Aug. 1, 2017

(54) COBALT-CONTAINING FILM FORMING COMPOSITIONS, THEIR SYNTHESIS, AND USE IN FILM DEPOSITION

(71) Applicant: L'Air Liquide, Société Anonyme pour l'Etude et l'Exploitation des Procédés Georges Claude, Paris (FR)

(72) Inventors: Satoko Gatineau, Seoul (KR); Mikiko Kimura, Tsukuba (JP); Christian Dussarrat, Tokyo (JP); Jean-Marc Girard, Versailles (FR); Nicolas Blasco, Grenoble (FR)

(73) Assignee: L'Air Liquide, Société Anonyme pour l'Etude et l'Exploitation des procédés Georges Claude, Paris (FR)

(*) Notice: Subject to any disclaimer, the term of this patent is extended or adjusted under 35 U.S.C. 154(b) by 0 days.

(21) Appl. No.: 14/986,286

(22) Filed: Dec. 31, 2015

(65) Prior Publication Data

US 2016/0115588 A1    Apr. 28, 2016

(51) Int. Cl.
*H01L 21/285* (2006.01)
*C23C 16/18* (2006.01)
(Continued)

(52) U.S. Cl.
CPC .............. *C23C 16/18* (2013.01); *C23C 16/42* (2013.01); *H01L 21/02697* (2013.01); *H01L 21/28556* (2013.01); *H01L 21/28568* (2013.01); *H01L 21/76841* (2013.01); *H01L 21/28518* (2013.01); *H01L 21/76843* (2013.01); *H01L 21/76898* (2013.01)

(58) Field of Classification Search
CPC ......... H01L 21/02697; H01L 21/28518; H01L 21/28556; H01L 21/28568; H01L 21/443; H01L 21/76841; H01B 1/22; C23C 16/18; C23C 16/42; C23C 16/448; C23C 16/45557

See application file for complete search history.

(56) References Cited

U.S. PATENT DOCUMENTS 6,849,122 B1 * 2/2005 Fair ........................ C23C 16/18
117/102
6,969,539 B2   11/2005 Gordon et al.
(Continued)

OTHER PUBLICATIONS

Baxter, D.V. et al., "Low pressure chemical vapor deposition of metallic films of iron, manganese, cobalt, copper, germanium and tin employing bis(trimethul)silylamido complexes, $M(N(SiMe_3)_2)_n$," Chemical Vapor Deposition, vol. 1, No. 2, 49-51.
(Continued)

*Primary Examiner* — Stephen W Smoot
(74) *Attorney, Agent, or Firm* — Patricia E. McQueeney

(57) ABSTRACT

Methods of depositing Co-containing layers on substrates are disclosed. The vapor of a Co-containing film forming composition is introduced into a reactor having a substrate disposed therein. The Co-containing film forming compositions comprise a silylamide-containing precursor selected from $Co[N(SiMe_3)_2]_2(NMe_2Et)$, $Co[N(SiMe_3)_2]_2(NMeEt_2)$, or combinations thereof. At least part of the silylamide-containing precursor is deposited onto the substrate to form the Co-containing layer using a vapor deposition method.

20 Claims, 5 Drawing Sheets

(51) Int. Cl.
C23C 16/42 (2006.01)
H01L 21/02 (2006.01)
H01L 21/768 (2006.01)

(56) References Cited

U.S. PATENT DOCUMENTS

| | | | |
|---|---|---|---|
| 8,461,684 B2 | 6/2013 | Gordon et al. | |
| 9,385,033 B2* | 7/2016 | Blackwell | H01L 21/76898 |
| 9,540,408 B2* | 1/2017 | Peters | C23C 16/18 |
| 2005/0064706 A1* | 3/2005 | Kim | H01L 21/28052 |
| | | | 438/664 |
| 2008/0132050 A1* | 6/2008 | Lavoie | C23C 14/0084 |
| | | | 438/584 |
| 2009/0029036 A1* | 1/2009 | Dussarrat | C07F 17/00 |
| | | | 427/96.1 |
| 2009/0053426 A1 | 2/2009 | Lu et al. | |
| 2009/0246952 A1 | 10/2009 | Ishizaka et al. | |
| 2014/0255606 A1 | 9/2014 | Thompson et al. | |
| 2015/0108646 A1 | 4/2015 | Chae et al. | |
| 2015/0221596 A1* | 8/2015 | Ren | H01L 23/53238 |
| | | | 257/751 |
| 2015/0368282 A1* | 12/2015 | Gatineau | C07F 15/06 |
| | | | 427/576 |

OTHER PUBLICATIONS

Bradley, D.C. et al., "Synthesis and chemistry of the bis(trimethylsilyl)amido bis-tetrahydrofuranates of the group 2 metals magnesium, calcium, strontium and barium. X-ray crystal structures of Mg[N(SiMe3)2]2•2THF and related Mn[N(SiMe3)2]2•2THF," Polyhedron 1990, vol. 9, No. 24, 2959-2964.

Bradley, D.C. et al., "Three-co-ordinated complexes of cobalt(II) and nickel(I) containing bis-trimethylsilylamino- and triphenylphosphine-ligands," J Chem Soc, Chem Commun, Issue 15, 1972, 872-873.

Bürger, H. et al., "Silylamide derivatives of iron and cobalt," Monatsch Chem (1963) 94(6), 1007-1012.

Gordon, R.G. et al., "Chemical vapor deposition (CVD) of manganese self-aligned diffusion barriers for Cu interconnections in microelectronics," accessed Nov. 19, 2016 at http://www.mrs.org/s_mrs/sec_detail.asp?CID-1728&DID-241813.

Murray, B.D. et al., "Three-coordinate metal amides of Manganese(II) and Cobalt(II)-synthesis and x-ray structure of the first tris(silylamide) of manganese and the x-ray crystal structures of $[M_2(N(SiMe_3)_2)_4]$ (M=Mn, Co)," Inorg. Chem. 1984, 23, 4584-4588.

Panda, A. et al., "Reactions of $M\{N(SiMe_3)_2\}_2$ (M=Mn, Fe or Co) with pyridine and 4,4'-bipyridyl: structural and magnetic studies," Polyhedron 22 (2003) 67-73.

Yang, J. et al., "Chemical Vapor Deposition of Cobalt Nitride and Its Application as an Adhesion-Enhancing Layer for Advanced Copper Interconnects," 2012 MRS Spring Meeting, Apr. 9-Apr. 13, 2012, San Francisco, CA, 19 pages.

* cited by examiner

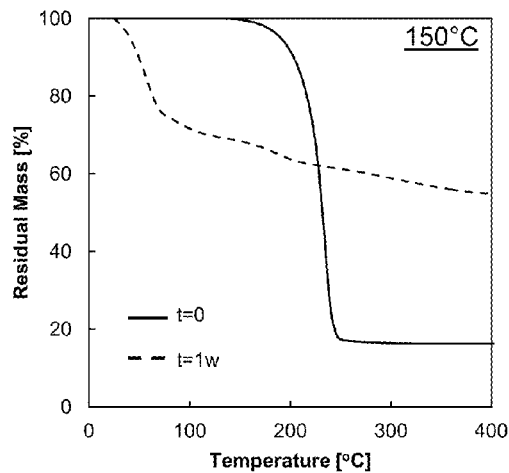
FIG 5 - Co[N(SiMe$_3$)$_2$]$_2$(py)
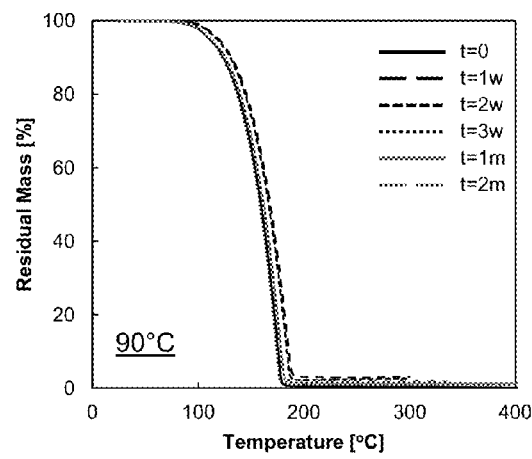
FIG 6 - Co[N(SiMe$_3$)$_2$]$_2$(Dimethylethylamine)
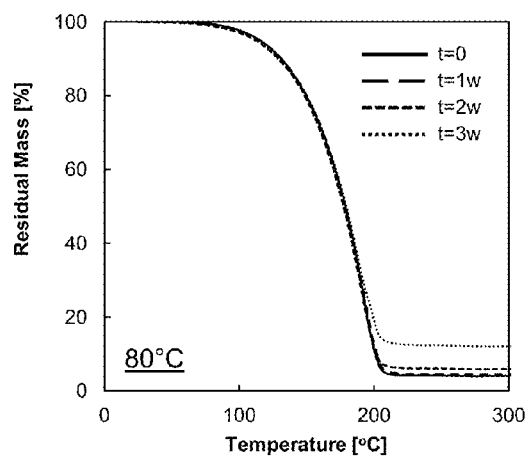
FIG 7 - Co[N(SiMe$_3$)$_2$]$_2$(Diethylmethylamine)
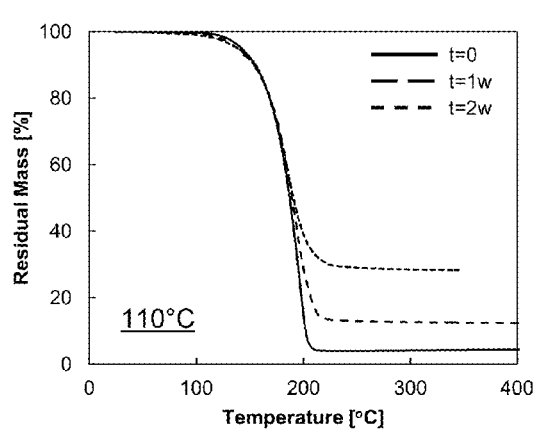
FIG 8 Co[N(SiMe$_3$)$_2$]$_2$(1-Me-pyrrolidine)

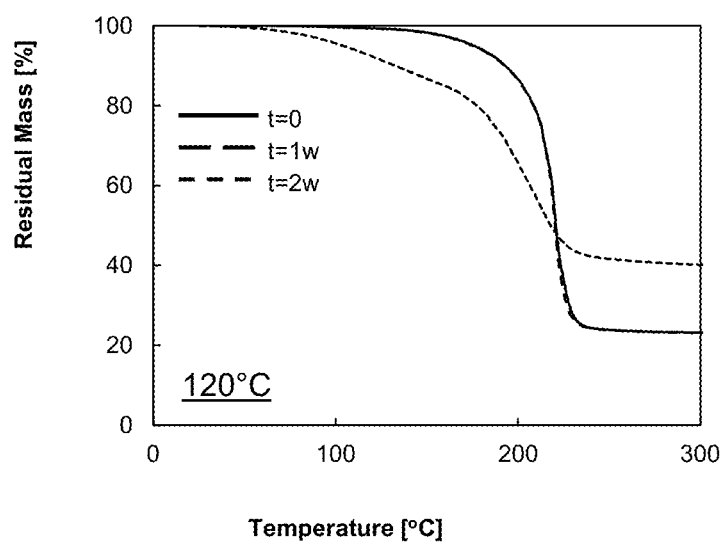
FIG 9 - Co[N(SiMe$_2$Et)$_2$]$_2$(dimethylethylamine)

COBALT-CONTAINING FILM FORMING COMPOSITIONS, THEIR SYNTHESIS, AND USE IN FILM DEPOSITION

TECHNICAL FIELD

Cobalt-containing film forming compositions, their preparation, and their use for the vapor deposition of films are disclosed. The cobalt-containing film forming compositions comprise silylamide-containing precursors, particularly $Co[N(SiMe_3)_2]_2(NMe_2Et)$ and/or $Co[N(SiMe_3)_2]_2(NMeEt_2)$.

BACKGROUND

Chemical Vapor Deposition (CVD) and Atomic Layer Deposition (ALD) have been applied as main deposition techniques for producing thin films for semiconductor devices. These methods enable the achievement of conformal films (metal, oxide, nitride, silicide, etc.) through fine tuning of parameters during the deposition processes. Mainly the film growth is controlled by chemical reactions of metal-containing compounds (precursors) and the development of optimum precursors is essential under prediction of their properties and reaction processes.

Films of transition metals and transition metal silicide, particularly manganese, iron, cobalt, and ruthenium, are becoming important for a variety of electronics and electrochemical applications. For example, cobalt thin films are of interest due to their high magnetic permittivity. There are many reports of using cobalt thin films to form cobalt disilicide ($CoSi_2$) for Ohmic contacts owing to its low resistivity in front-end-of-the-line processing of semiconductor devices. Cobalt containing thin films were recently studied as Cu/low-k barriers, passivation layers, and capping layers for ultra-large scale integrated devices.

Synthesis of silylamide compounds has been reported (Monatsh. Chem. (1963), 94(6), pp. 1007-1012; Polyhedron 22 (2003) pp. 67-73, J.C.S. Chem. Comm. (1972) pp. 872-873; Inorg. Chem. (1984) 23, 4584-4588; U.S. Pat. No. 6,969,539B2). Vapor deposition film formation using silylamide compounds has also been reported. (Chem. Vap. Deposition 1995, 1, No. 2, 49-51; R. G. Gordon et al; US 2009/0053426A1 Applied Materials; US 2014/0255606 Applied Materials).

Selecting a Co-containing precursor that is suitably volatile while remaining stable enough for use in vapor phase film deposition is important for commercial implementation and not always easily determined.

SUMMARY

Disclosed are cobalt-containing film forming compositions comprising a silylamide-containing precursor having the formula:

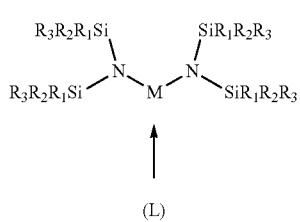

Formula I

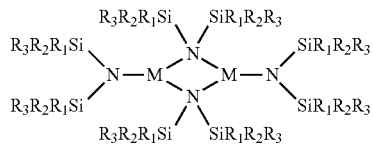

Formula II

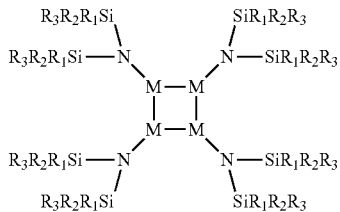

Formula III wherein M is Co; each $R_1$, $R_2$ and $R_3$ is independently selected from hydrogen (H), methyl, ethyl, isopropyl, n-propyl, n-butyl, or t-butyl; and L is one or two neutral adducts selected from pyridine, $NMe_3$, $NEt_3$, $NMe_2Et$, $NMeEt_2$, 1-Me-pyrrolidine, or $PMe_3$; and $R^1$ and $R^2$ or $R^2$ and $R^3$ may be joined to form a cyclic silicon-containing heterocycle. The disclosed silylamide-containing film forming compositions may have one or more of the following aspects:
- the silylamide-containing precursor being $\{Co[N(SiMe_3)_2]_2\}_2$;
- the silylamide-containing precursor being $Co[N(SiMe_3)_2]_2(py)$;
- the silylamide-containing precursor being $Co[N(SiMe_3)_2]_2(Me_3N)$;
- the silylamide-containing precursor being $Co[N(SiMe_3)_2]_2(Et_3N)$;
- the silylamide-containing precursor being $Co[N(SiMe_3)_2]_2(Me_2EtN)$;
- the silylamide-containing precursor being $Co[N(SiMe_3)_2]_2(MeEt_2N)$;
- the silylamide-containing precursor being $Co[N(SiMe_3)_2]_2(1\text{-Me-pyrrolidine})$;
- the silylamide-containing precursor being $Co[N(SiMe_3)_2]_2(PMe_3)$;
- the silylamide-containing precursor being $\{Co[N(SiMe_2Et)_2]_2\}_2$;
- the silylamide-containing precursor being $Co[N(SiMe_2Et)_2]_2(py)$;
- the silylamide-containing precursor being $Co[N(SiMe_2Et)_2]_2(Me_3N)$;
- the silylamide-containing precursor being $Co[N(SiMe_2Et)_2]_2(Et_3N)$;
- the silylamide-containing precursor being $Co[N(SiMe_2Et)_2]_2(Me_2EtN)$;
- the silylamide-containing precursor being $Co[N(SiMe_2Et)_2]_2(MeEt_2N)$;
- the silylamide-containing precursor being $Co[N(SiMe_2Et)_2]_2(1\text{-Me-pyrrolidine})$;
- the silylamide-containing precursor being $Co[N(SiMe_2Et)_2]_2(PMe_3)$,
- the cobalt-containing film forming composition comprising between approximately 99% w/w and approximately 100% w/w of the silylamide-containing precursor;
- the cobalt-containing film forming composition comprising between approximately 99% w/w and approximately 100% w/w of the silylamide-containing precursor after 4 weeks at 50° C.;

the cobalt-containing film forming composition comprising between approximately 99% w/w and approximately 100% w/w of the silylamide-containing precursor after 12 weeks at room temperature (approximately 23° C.);
the cobalt-containing film forming composition producing less than 3% residual mass under thermogravimetric analysis after 2 weeks of stability testing at a temperature that produces 1 Torr vapor pressure of the silylamide-containing precursor;
the cobalt-containing film forming composition producing less than 3% residual mass under thermogravimetric analysis after 3 weeks of stability testing at a temperature that produces 1 Torr vapor pressure of the silylamide-containing precursor;
the cobalt-containing film forming composition producing less than 3% residual mass under thermogravimetric analysis after 2 months of stability testing at a temperature that produces 1 Torr vapor pressure of the silylamide-containing precursor;
the cobalt-containing film forming composition comprising between approximately 95% w/w and approximately 100% w/w of the silylamide-containing precursor;
the Co-containing film forming composition comprising between approximately 5% w/w and approximately 50% w/w of the silylamide-containing precursor;
the Co-containing film forming composition comprising no water;
the Co-containing film forming composition comprising between approximately 0% w/w and approximately 5% w/w impurities;
the Co-containing film forming composition comprising between approximately 0.0% w/w and approximately 2.0% w/w impurities;
the Co-containing film forming composition comprising between approximately 0.0% w/w and approximately 1.0% w/w impurities;
the impurities including halides, alkali metals, alkyl-substituted silanes, lithium, sodium, or potassium halides; THF; ether; pentane; cyclohexane; heptanes; benzene; toluene;
the Co-containing film forming composition comprising between approximately 0 ppbw and approximately 1 ppmw metal impurities;
the Co-containing film forming composition comprising between approximately 0 ppbw and approximately 500 ppbw metal impurities;
the Co-containing film forming composition comprising between approximately 0 ppbw and approximately 100 ppbw Al;
the Co-containing film forming composition comprising between approximately 0 ppbw and approximately 100 ppbw As;
the Co-containing film forming composition comprising between approximately 0 ppbw and approximately 100 ppbw Ba;
the Co-containing film forming composition comprising between approximately 0 ppbw and approximately 100 ppbw Be;
the Co-containing film forming composition comprising between approximately 0 ppbw and approximately 100 ppbw Bi;
the Co-containing film forming composition comprising between approximately 0 ppbw and approximately 100 ppbw Cd;
the Co-containing film forming composition comprising between approximately 0 ppbw and approximately 100 ppbw Ca;
the Co-containing film forming composition comprising between approximately 0 ppbw and approximately 100 ppbw Cr;
the Co-containing film forming composition comprising between approximately 0 ppbw and approximately 100 ppbw Co;
the Co-containing film forming composition comprising between approximately 0 ppbw and approximately 100 ppbw Cu;
the Co-containing film forming composition comprising between approximately 0 ppbw and approximately 100 ppbw Ga;
the Co-containing film forming composition comprising between approximately 0 ppbw and approximately 100 ppbw Ge;
the Co-containing film forming composition comprising between approximately 0 ppbw and approximately 100 ppbw Hf;
the Co-containing film forming composition comprising between approximately 0 ppbw and approximately 100 ppbw Zr;
the Co-containing film forming composition comprising between approximately 0 ppbw and approximately 100 ppbw In;
the Co-containing film forming composition comprising between approximately 0 ppbw and approximately 100 ppbw Fe;
the Co-containing film forming composition comprising between approximately 0 ppbw and approximately 100 ppbw Pb;
the Co-containing film forming composition comprising between approximately 0 ppbw and approximately 100 ppbw Li;
the Co-containing film forming composition comprising between approximately 0 ppbw and approximately 100 ppbw Mg;
the Co-containing film forming composition comprising between approximately 0 ppbw and approximately 100 ppbw Mn;
the Co-containing film forming composition comprising between approximately 0 ppbw and approximately 100 ppbw W;
the Co-containing film forming composition comprising between approximately 0 ppbw and approximately 100 ppbw Ni;
the Co-containing film forming composition comprising between approximately 0 ppbw and approximately 100 ppbw K;
the Co-containing film forming composition comprising between approximately 0 ppbw and approximately 100 ppbw Na;
the Co-containing film forming composition comprising between approximately 0 ppbw and approximately 100 ppbw Sr;
the Co-containing film forming composition comprising between approximately 0 ppbw and approximately 100 ppbw Th;
the Co-containing film forming composition comprising between approximately 0 ppbw and approximately 100 ppbw Sn;
the Co-containing film forming composition comprising between approximately 0 ppbw and approximately 100 ppbw Ti;

the Co-containing film forming composition comprising between approximately 0 ppbw and approximately 100 ppbw U;

the Co-containing film forming composition comprising between approximately 0 ppbw and approximately 100 ppbw V;

the Co-containing film forming composition comprising between approximately 0 ppbw and approximately 100 ppbw Zn;

the Co-containing film forming composition comprising between approximately 0 ppmw and approximately 100 ppmw Cl;

the Co-containing film forming composition comprising between approximately 0 ppmw and approximately 100 ppmw Br.

Also disclosed is a Co-containing film forming composition delivery device comprising a canister having an inlet conduit and an outlet conduit and containing any of the Co-containing film forming compositions disclosed above. The disclosed device may include one or more of the following aspects:

the Co-containing film forming composition having a total concentration of metal contaminants of less than 10 ppmw;

an end of the inlet conduit end located above a surface of the Co-containing film forming composition and an end of the outlet conduit located below the surface of the Co-containing film forming composition;

an end of the inlet conduit end located below a surface of the Co-containing film forming composition and an end of the outlet conduit located above the surface of the Co-containing film forming composition;

further comprising a diaphragm valve on the inlet and the outlet;

further comprising one or more barrier layers on an interior surface of the canister;

further comprising one to four barrier layers on an interior surface of the canister;

further comprising one or two barrier layers on an interior surface of the canister;

each barrier layer comprising a silicon oxide layer, silicon nitride layer, silicon oxynitride layer, silicon carbonitride, silicon oxycarbonitride layer, or combinations thereof;

wherein each barrier layer is 5 to 1000 nm in thickness;

wherein each barrier layer is 50 to 500 nm in thickness;

the Co-containing film forming composition comprising $Co[N(SiMe_3)_2]_2(NMe_2Et)$; and the Co-containing film forming composition comprising $Co[N(SiMe_3)_2]_2(NMeEt_2)$.

Also disclosed are methods of depositing a Co-containing layer on a substrate. The vapor of any of the Co-containing film forming compositions disclosed above is introduced into a reactor having a substrate disposed therein. At least part of the silylamide-containing precursor is deposited onto the substrate to form a Co-containing layer using a vapor deposition method. The disclosed methods may have one or more of the following aspects:

The Co-containing film forming compositions comprising a silylamide-containing precursor selected from $Co[N(SiMe_3)_2]_2(NMe_2Et)$, $Co[N(SiMe_3)_2]_2(NMeEt_2)$, or combinations thereof;

The silylamide-containing precursor being $Co[N(SiMe_3)_2]_2(NMe_2Et)$;

The silylamide-containing precursor being $Co[N(SiMe_3)_2]_2(NMeEt_2)$;

introducing into the reactor a vapor comprising a second precursor;

an element of the second precursor being selected from the group consisting of group 2, group 13, group 14, transition metal, lanthanides, and combinations thereof;

the element of the second precursor being selected from Mg, Ca, Sr, Ba, Zr, Hf, Ti, Nb, Ta, Al, Si, Ge, Y, or lanthanides;

introducing a reactant into the reactor;

the reactant being selected from the group consisting of $O_2$, $O_3$, $H_2O$, $H_2O_2$, NO, $NO_2$, a carboxylic acid, radicals thereof, and combinations thereof;

the reactant being plasma treated oxygen;

the reactant being ozone;

the reactant being selected from the group consisting of $H_2$, $NH_3$, $(SiH_3)_3N$, hydridosilanes (such as $SiH_4$, $Si_2H_6$, $Si_3H_8$, $Si_4H_{10}$, $Si_5H_{10}$, $Si_6H_{12}$), chlorosilanes and chloropolysilanes (such as $SiHCl_3$, $SiH_2Cl_2$, $SiH_3Cl$, $Si_2Cl_6$, $Si_2HCl_5$, $Si_3Cl_8$), alkysilanes (such as $Me_2SiH_2$, $Et_2SiH_2$, $MeSiH_3$, $EtSiH_3$), hydrazines (such as $N_2H_4$, $MeHNNH_2$, MeHNNHMe), organic amines (such as $NMeH_2$, $NEtH_2$, $NMe_2H$, $NEt_2H$, $NMe_3$, $NEt_3$, $(SiMe_3)_2NH$), pyrazoline, pyridine, B-containing molecules (such as $B_2H_6$, 9-borabicylo[3,3,1]none, trimethylboron, triethylboron, borazine), alkyl metals (such as trimethylaluminum, triethylaluminum, dimethylzinc, diethylzinc), radical species thereof, and mixtures thereof;

the reactant being selected from the group consisting of $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, and mixtures thereof;

the reactant being selected from the group consisting of $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, nitrogen-containing radical species thereof, and mixtures thereof;

the reactant being HCDS or PCDS;

the reactant being plasma treated $N_2$;

the vapor deposition method being a CVD process;

the vapor deposition method being an ALD process;

the vapor deposition method being a PEALD process; the vapor deposition method being a spatial ALD process;

the Co-containing layer being a cobalt oxide layer;

the Co-containing layer being Co; and the Co-containing layer being CoSi.

NOTATION AND NOMENCLATURE

Certain abbreviations, symbols, and terms are used throughout the following description and claims, and include:

As used herein, the indefinite article "a" or "an" means one or more.

As used herein, the terms "approximately" or "about" mean±10% of the value stated.

Any and all ranges recited herein are inclusive of their endpoints (i.e., x=1 to 4 includes x=1, x=4, and x=any number in between).

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl.

Examples of cyclic alkyl groups include without limitation, cyclopropyl groups, cyclopentyl groups, cyclohexyl groups, etc.

As used herein, the term "hydrocarbon" means a functional group containing exclusively hydrogen and carbon atoms. The functional group may be saturated (containing only single bonds) or unsaturated (containing double or triple bonds).

As used herein, the term "heterocycle" means cyclic compounds that have atoms of at least two different elements as members of its ring.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, t-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; and the abbreviation "Cp" refers to cyclopentadienyl group.

The standard abbreviations of the elements from the periodic table of elements are used herein. It should be understood that elements may be referred to by these abbreviations (e.g., Co refers to cobalt, Si refers to silicon, C refers to carbon, etc.)

Please note that the films or layers deposited, such as cobalt oxide, are listed throughout the specification and claims without reference to their proper stoichiometry (i.e., $CoSi_2$). The layers may include pure (M) layers, silicide $(M_oSi_p)$ layers, carbide $(M_oC_p)$ layers, nitride $(M_kN_l)$ layers, oxide $(M_nO_m)$ layers, or mixtures thereof, wherein M is Co, Mn, Fe, or Ru; and k, l, m, n, o, and p inclusively range from 1 to 6. For instance, cobalt silicide is $Co_kSi_l$, where k and l each range from 0.5 to 5. Similarly, $Co_nO_m$ may include CoO and $Co_3O_4$. Any referenced layers may also include a Silicon oxide layer, $Si_nO_m$, wherein n ranges from 0.5 to 1.5 and m ranges from 1.5 to 3.5. More preferably, the silicon oxide layer is $SiO_2$ or $SiO_3$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 5 is a comparative TGA graph demonstrating the percentage of weight loss with increasing temperature of Co[N(SiMe$_3$)$_2$]$_2$(py) before and after 1 week of stability testing at 150° C.;

FIG. 6 is a comparative TGA graph demonstrating the percentage of weight loss with increasing temperature of Co[N(SiMe$_3$)$_2$]$_2$(NMe$_2$Et) before and after 1, 2, and 3 weeks and 1 and 2 months of stability testing at 90° C.;

FIG. 7 is a comparative TGA graph demonstrating the percentage of weight loss with increasing temperature of Co[N(SiMe$_3$)$_2$]$_2$(NMeEt$_2$) before and after 1, 2, and 3 weeks of stability testing at 80° C.;

FIG. 8 is a comparative TGA graph demonstrating the percentage of weight loss with increasing temperature of Co[N(SiMe$_3$)$_2$]$_2$(1-Me-pyrrolidine) before and after 1 and 2 weeks of stability testing at 110° C.; and FIG. 9 is a comparative TGA graph demonstrating the percentage of weight loss with increasing temperature of Co[N(SiMe$_2$Et)$_2$]$_2$(NMe$_2$Et) before and after 1 and 2 weeks of stability testing at 120° C.

DESCRIPTION OF PREFERRED EMBODIMENTS

Figure 1:
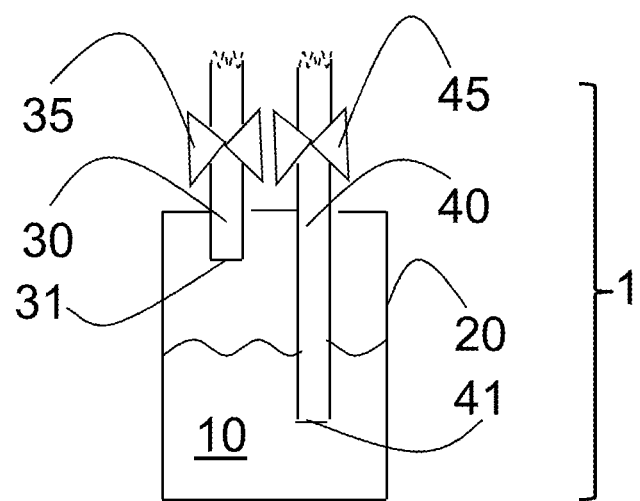
FIG. 1 is a side view of one embodiment of the Co-containing film forming composition delivery device 1.

Disclosed are Co-containing film forming compositions comprising silylamide-containing precursors having the following formula:

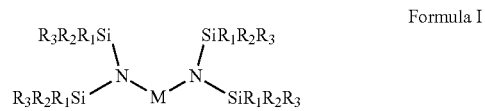

Formula I

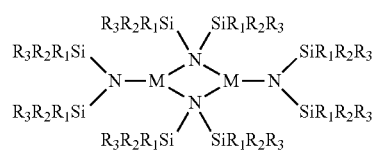

Formula II

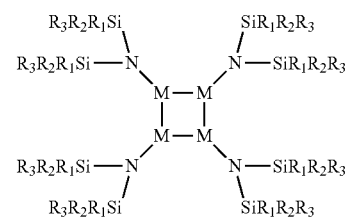

Formula III wherein M is Co; each $R_1$, $R_2$ and $R_3$ is independently selected from hydrogen (H), methyl, ethyl, isopropyl, n-propyl, n-butyl, or t-butyl; and L is one or two neutral adducts selected from pyridine, NMe$_3$, NEt$_3$, NMe$_2$Et, NMeEt$_2$, 1-Me-pyrrolidine, or PMe$_3$; and $R^1$ and $R^2$ or $R^2$ and $R^3$ may be joined to form a cyclic silicon-containing heterocycle.

Exemplary silylamide-containing precursors include {Co[N(SiMe$_3$)$_2$]$_2$}$_2$; Co[N(SiMe$_3$)$_2$]$_2$(py); Co[N(SiMe$_3$)$_2$]$_2$(Me$_3$N); Co[N(SiMe$_3$)$_2$]$_2$(Et$_3$N); Co[N(SiMe$_3$)$_2$]$_2$ (Me$_2$EtN); Co[N(SiMe$_3$)$_2$]$_2$(MeEt$_2$N); Co[N(SiMe$_3$)$_2$]$_2$(1-Me-pyrrolidine); Co[N(SiMe$_3$)$_2$]$_2$(PMe$_3$); {Co[N(SiMe$_2$Et)$_2$]$_2$}$_2$; Co[N(SiMe$_2$Et)$_2$]$_2$(py); Co[N(SiMe$_2$Et)$_2$]$_2$(Me$_3$N); Co[N(SiMe$_2$Et)$_2$]$_2$(Et$_3$N); Co[N(SiMe$_2$Et)$_2$]$_2$(Me$_2$EtN); Co[N(SiMe$_2$Et)$_2$]$_2$(MeEt$_2$N); Co[N(SiMe$_2$Et)$_2$]$_2$(1-Me-pyrrolidine); Co[N(SiMe$_2$Et)$_2$]$_2$(PMe$_3$); and combinations thereof.

The silylamide-containing precursors may be synthesized by reacting CoX$_2$, wherein X is Cl, Br, or I, with M(N(SiR$^1$R$^2$R$^3$)$_2$), wherein M is Li, Na, or K, in a solvent, such as tetrahydrofuran (THF), ether, pentane, cyclohexane, hexane, heptane, or toluene. The solvent may be removed and the product of Formula I, II, or III isolated from the salt byproduct using filtration and/or sublimation. The L=THF adduct of Formula I may be substituted by adding the protonated form of the desired ligand to an alkane solution, such as pentane, heptane, hexane, or cyclohexane, of the THF-containing precursor and extracting the product. Further details are provided in the examples that follow.

To ensure process reliability, the disclosed Co-containing film forming compositions may be purified by continuous or fractional batch distillation, recrystallization, or sublimation prior to use to a purity ranging from approximately 95% w/w to approximately 100% w/w, preferably ranging from approximately 98% w/w to approximately 100% w/w. One of ordinary skill in the art will recognize that the purity may be determined by H NMR or gas or liquid chromatography with mass spectrometry. The Co-containing film forming compositions may contain any of the following impurities: halides, alkali metals, alkyl amines, alkylamino-substituted silanes, pyridine, 1-methylpyrrolidine, pyrrolidine, THF, ether, pentane, cyclohexane, heptane, toluene, halogenated metal compounds. Preferably, the total quantity of these impurities is below 0.1% w/w. The purified composition may be produced by recrystallization, sublimation, distillation, and/or passing the gas or liquid through a suitable adsorbent, such as a 4 Å molecular sieves.

The concentration of each solvent, such as THF, ether, pentane, cyclohexane, heptanes, and/or toluene, in the purified Co-containing film forming compositions may range from approximately 0% w/w to approximately 5% w/w, preferably from approximately 0% w/w to approximately 0.1% w/w. Solvents may be used in the Co-containing film forming composition's synthesis. Separation of the solvents from the composition may be difficult if both have similar boiling points. Cooling the mixture may produce solid precursor in liquid solvent, which may be separated by filtration. Vacuum distillation may also be used, provided the composition is not heated above approximately its decomposition point.

The disclosed Co-containing film forming composition contains less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by distillation of the Co-containing film forming composition.

Alternatively, the disclosed Co-containing film forming compositions may comprise between approximately 5% w/w to approximately 50% w/w of one compound with the balance of the composition comprising a second compound, particularly when the mixture provides improved process parameters or isolation of the target compound is too difficult or expensive. For example, the disclosed Co-containing film forming compositions may be 40/60% w/w of Co[N(SiMe$_3$)$_2$]$_2$(NMe$_2$Et) and Co[N(SiMe$_3$)$_2$]$_2$(NMeEt$_2$). The mixture may produce a stable, liquid composition suitable for vapor deposition.

The concentration of trace metals and metalloids in the purified Co-containing film forming composition may each range independently from approximately 0 ppbw to approximately 100 ppbw, and more preferably from approximately 0 ppbw to approximately 10 ppbw. These metal or metalloid impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), Vanadium (V) and Zinc (Zn). The concentration of X (where X=Cl, Br) in the purified Co-containing film forming composition may range between approximately 0 ppmw and approximately 100 ppmw and more preferably between approximately 0 ppmw to approximately 10 ppmw.

Care should be taken to prevent exposure of the disclosed Co-containing film forming compositions to water as this may result in decomposition of the silylamine-containing precursors.

Figure 2:
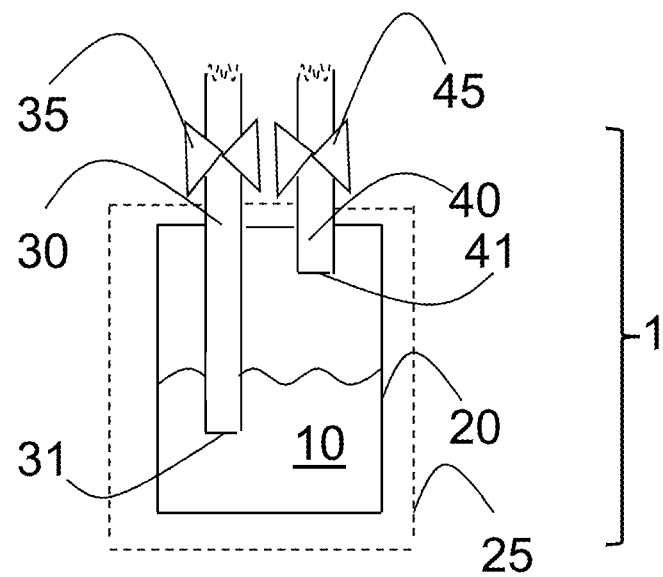
FIG. 2 is a side view of a second embodiment of the Co-containing film forming composition delivery device 1.

The disclosed Co-containing film forming compositions may be delivered to a semiconductor processing tool by the disclosed Co-containing film forming composition delivery devices. FIGS. 1 and 2 show two embodiments of the disclosed delivery devices 1. FIG. 1 is a side view of one embodiment of the Co-containing film forming composition delivery device 1. In FIG. 1, the disclosed Co-containing film forming composition 10 is contained within a container 20 having two conduits, an inlet conduit 30 and an outlet conduit 40. One of ordinary skill in the precursor art will recognize that the container 20, inlet conduit 30, and outlet conduit 40 are manufactured to prevent the escape of the gaseous form of the Co-containing film forming composition 10, even at elevated temperature and pressure.

Suitable valves include spring-loaded or tied diaphragm valves. The valve may further comprise a restrictive flow orifice (RFO). The delivery device should be connected to a gas manifold and in an enclosure. The gas manifold should permit the safe evacuation and purging of the piping that may be exposed to air when the delivery device is replaced so that any residual amounts of the material do not react. The enclosure should be equipped with sensors and fire control capability to control the fire in the case of a pyrophoric material release. The gas manifold should also be equipped with isolation valves, vacuum generators, and permit the introduction of a purge gas at a minimum.

The delivery device must be leak tight and be equipped with valves that do not permit escape of even minute amounts of the material. The delivery device fluidly connects to other components of the semiconductor processing tool, such as the gas cabinet disclosed above, via valves 35 and 45. Preferably, the delivery device 20, inlet conduit 30, valve 35, outlet conduit 40, and valve 45 are made of 316L EP or 304 stainless steel. However, one of ordinary skill in the art will recognize that other non-reactive materials may also be used in the teachings herein and that any corrosive Co-containing film forming composition 10 may require the use of more corrosion-resistant materials, such as Hastelloy or Inconel.

In FIG. 1, the end 31 of inlet conduit 30 is located above the surface of the Co-containing film forming composition 10, whereas the end 41 of the outlet conduit 40 is located below the surface of the Co-containing film forming composition 10. In this embodiment, the Co-containing film forming composition 10 is preferably in liquid form. An inert gas, including but not limited to nitrogen, argon, helium, and mixtures thereof, may be introduced into the inlet conduit 30. The inert gas pressurizes the delivery device 20 so that the liquid Co-containing film forming composition 10 is forced through the outlet conduit 40 and to components in the semiconductor processing tool (not shown).

The semiconductor processing tool may include a vaporizer which transforms the liquid Co-containing film forming composition 10 into a vapor, with or without the use of a carrier gas such as helium, argon, nitrogen or mixtures thereof, in order to deliver the vapor to a chamber where a wafer to be repaired is located and treatment occurs in the vapor phase. Alternatively, the liquid Co-containing film forming composition 10 may be delivered directly to the wafer surface as a jet or aerosol.

FIG. 2 is a side view of a second embodiment of the Co-containing film forming composition delivery device 1. In FIG. 2, the end 31 of inlet conduit 30 is located below the surface of the Co-containing film forming composition 10, whereas the end 41 of the outlet conduit 40 is located above the surface of the Co-containing film forming composition 10. FIG. 2, also includes an optional heating element 25, which may increase the temperature of the Co-containing film forming composition 10. The Co-containing film forming composition 10 may be in solid or liquid form. An inert gas, including but not limited to nitrogen, argon, helium, and mixtures thereof, is introduced into the inlet conduit 30. The inert gas flows through the Co-containing film forming composition 10 and carries a mixture of the inert gas and vaporized Co-containing film forming composition 10 to the outlet conduit 40 and on to the components in the semiconductor processing tool.

Both FIGS. 1 and 2 include valves 35 and 45. One of ordinary skill in the art will recognize that valves 35 and 45 may be placed in an open or closed position to allow flow through conduits 30 and 40, respectively. Either delivery device 1 in FIG. 1 or 2, or a simpler delivery device having a single conduit terminating above the surface of any solid or liquid present, may be used if the Co-containing film forming composition 10 is in vapor form or if sufficient vapor pressure is present above the solid/liquid phase. In this case, the Co-containing film forming composition 10 is delivered in vapor form through the conduit 30 or 40 simply by opening the valve 35 in FIG. 1 or 45 in FIG. 2, respectively. The delivery device 1 may be maintained at a suitable temperature to provide sufficient vapor pressure for the Co-containing film forming composition 10 to be delivered in vapor form, for example by the use of an optional heating element 25.

While FIGS. 1 and 2 disclose two embodiments of the Co-containing film forming composition delivery device 1, one of ordinary skill in the art will recognize that the inlet conduit 30 and outlet conduit 40 may both be located above or below the surface of the Co-containing film forming composition 10 without departing from the disclosure herein. Furthermore, inlet conduit 30 may be a filling port. Finally, one of ordinary skill in the art will recognize that the disclosed Co-containing film forming composition may be delivered to semiconductor processing tools using other delivery devices, such as the ampoules disclosed in WO 2006/059187 to Jurcik et al., without departing from the teachings herein.

Also disclosed are methods of using the disclosed Co-containing film forming compositions for vapor deposition methods. The disclosed methods provide for the use of the Co-containing film forming compositions for deposition of cobalt-containing films. The disclosed methods may be useful in the manufacture of semiconductor, photovoltaic, LCD-TFT, flat panel type devices, refractory materials, or aeronautics.

The disclosed methods for forming a cobalt-containing layer on a substrate include: placing a substrate in a reactor, delivering into the reactor a vapor of the disclosed Co-containing film forming composition, and contacting the vapor with the substrate (and typically directing the vapor to the substrate) to form a cobalt-containing layer on the surface of the substrate.

The methods may include forming a bimetal-containing layer on a substrate using the vapor deposition process and, more specifically, for deposition of $CoMO_x$ films wherein x is 4 and M is Ta, Hf, Nb, Mg, Al, Sr, Y, Ba, Ca, As, Sb, Bi, Sn, Pb, Co, lanthanides (such as Er), or combinations thereof. The disclosed methods may be useful in the manufacture of semiconductor, photovoltaic, LCD-TFT, or flat panel type devices. An oxygen source, such as $O_3$, $O_2$, $H_2O$, NO, $H_2O_2$, acetic acid, formalin, para-formaldehyde, oxygen radicals thereof, and combinations thereof, but preferably $O_3$ or plasma treated $O_2$, may also be introduced into the reactor.

The disclosed Co-containing film forming compositions may be used to deposit cobalt-containing films using any deposition methods known to those of skill in the art. Examples of suitable deposition methods include chemical vapor deposition (CVD) or atomic layer deposition (ALD). Exemplary CVD methods include thermal CVD, pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, plasma enhanced CVD (PECVD) including but not limited to flowable PECVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

The vapor of the Co-containing film forming composition is generated and then introduced into a reaction chamber containing a substrate. The temperature and the pressure in the reaction chamber and the temperature of the substrate are held at conditions suitable for vapor deposition of at least part of the silylamine-containing precursor onto the substrate. In other words, after introduction of the vaporized composition into the reaction chamber, conditions within the reaction chamber are adjusted such that at least part of the precursor is deposited onto the substrate to form the Co-containing layer. One of ordinary skill in the art will recognize that "at least part of the precursor is deposited" means that some or all of the precursor reacts with or adheres to the substrate. Herein, a reactant may also be used to help in formation of the Co-containing layer.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 20 Torr for all ALD and subatmospheric CVD. Subatmospheric CVD and atmospheric CVD pressures may range up to 760 Torr (atmosphere). In addition, the temperature within the reaction chamber may range from about 20° C. to about 600° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 600° C. When a plasma deposition process is utilized, the deposition temperature may range from approximately 20° C. to approximately 550° C. Alternatively, when a thermal process is performed, the deposition temperature may range from approximately 300° C. to approximately 600° C.

Alternatively, the substrate may be heated to a sufficient temperature to obtain the desired cobalt-containing film at a sufficient growth rate and with desired physical state and composition. A non-limiting exemplary temperature range to which the substrate may be heated includes from 150° C. to 600° C. Preferably, the temperature of the substrate remains less than or equal to 500° C.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (Si-COH) layers, or combinations thereof. Additionally, the wafers may include copper layers or noble metal layers (e.g. platinum, palladium, rhodium, or gold). The layers may include oxides which are used as dielectric materials in MIM, DRAM, or FeRam technologies (e.g., $ZrO_2$ based materials, $HfO_2$ based materials, $TiO_2$ based materials, rare earth oxide based materials, ternary oxide based materials such as strontium ruthenium oxide [SRO], etc.) or from nitride-based films (e.g., TaN) that are used as an oxygen barrier between copper and the low-k layer. The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. For example, the layer may be a patterned photoresist film made of hydrogenated carbon, for example $CH_x$, wherein x is greater than zero.

The disclosed processes may deposit the cobalt-containing layer directly on the wafer or directly on one or more than one (when patterned layers form the substrate) of the layers on top of the wafer. The substrate may be patterned to include vias or trenches having high aspect ratios. For example, a conformal Co-containing film, such as $CoSi_2$, may be deposited using any ALD technique on a through silicon via (TSV) having an aspect ratio ranging from approximately 20:1 to approximately 100:1. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. In many instances though, the preferred substrate utilized may be selected from hydrogenated carbon, TiN, SRO, Ru, and Si type substrates, such as polysilicon or crystalline silicon substrates.

The disclosed Co-containing film forming compositions may further comprise a solvent, such as toluene, ethyl benzene, xylene, mesitylene, decane, dodecane, octane, hexane, pentane, tertiary amines, acetone, tetrahydrofuran, ethanol, ethylmethylketone, 1,4-dioxane, or others. The disclosed compositions may be present in varying concentrations in the solvent. For example, the resulting concentration may range from approximately 0.05M to approximately 2M.

The neat or blended Co-containing film forming compositions are delivered into a reactor in vapor form by conventional means, such as tubing and/or flow meters. The composition in vapor form may be produced by vaporizing the neat or blended composition through a conventional vaporization step such as direct vaporization, distillation, by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling of the carrier gas into the composition. The carrier gas may include, but is not limited to, Ar, He, or $N_2$, and mixtures thereof. Bubbling with a carrier gas may also remove any dissolved oxygen present in the neat or blended composition. The carrier gas and composition are then introduced into the reactor as a vapor.

If necessary, the container may be heated to a temperature that permits the Co-containing film forming composition to be in its liquid phase and to have a sufficient vapor pressure. The container may be maintained at temperatures in the range of, for example, 0-150° C. Those skilled in the art recognize that the temperature of the container may be adjusted in a known manner to control the amount of Co-containing film forming composition vaporized.

In addition to the disclosed precursor, a reactant may also be introduced into the reactor. The reactant may be an oxidizing agent, such as one of $O_2$, $O_3$, $H_2O$, $H_2O_2$; oxygen containing radicals, such as O. or OH., NO, $NO_2$; carboxylic acids such as formic acid, acetic acid, propionic acid, radical species of NO, $NO_2$, or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as O. or OH., and mixtures thereof. Preferably, when an ALD process is performed, the reactant is plasma treated oxygen, ozone, or combinations thereof. When an oxidizing agent is used, the resulting cobalt containing film will also contain oxygen.

Alternatively, the reactant may be a reducing agent such as one of $H_2$, $NH_3$, $(SiH_3)_3N$, hydridosilanes (for example, $SiH_4$, $Si_2H_6$, $Si_3H_8$, $Si_4H_{10}$, $Si_5H_{10}$, $Si_6H_{12}$), chlorosilanes and chloropolysilanes (for example, $SiHCl_3$, $SiH_2Cl_2$, $SIH_3Cl$, $Si_2Cl_6$, $Si_2HCl_5$, $Si_3Cl_8$), alkylsilanes (for example, $(CH_3)_2SiH_2$, $(C_2H_5)_2SiH_2$, $(CH_3)SiH_3$, $(C_2H_5)SiH_3$), hydrazines (for example, $N_2H_4$, MeHNNH$_2$, MeHNNHMe), organic amines (for example, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$), pyrazoline, pyridine, B-containing molecules (for example, $B_2H_6$, 9-borabicyclo[3,3,1]none, trimethylboron, triethylboron, borazine), alkyl metals (such as trimethylaluminum, triethylaluminum, dimethylzinc, diethylzinc), radical species thereof, and mixtures thereof. Preferably, the reducing agent is $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, or mixtures thereof. Preferably, the reducing agent is $SiHCl_3$, $Si_2Cl_6$, $Si_2HCl_5$, $Si_2H_2Cl_4$, and cyclo-$Si_6H_6Cl_6$. When a reducing agent is used, the resulting Co-containing film may be pure Co.

The reactant may be treated by plasma, in order to decompose the reactant into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The disclosed Co-containing film forming composition may also be used with a halosilane or polyhalodisilane, such as hexachlorodisilane, pentachlorodisilane, or tetrachlorodisilane, and one or more reactants to form CoSi, CoSiCN, or CoSiCOH films.

When the desired Co-containing film also contains another element, such as, for example and without limitation, Ta, Hf, Nb, Mg, Al, Sr, Y, Ba, Ca, As, Sb, Bi, Sn, Pb, Co, lanthanides (such as Er), or combinations thereof, the reactants may include a another precursor which is selected from, but not limited to, alkyls, such as $Ln(RCp)_3$, amines, such as $Nb(Cp)(NtBu)(NMe_2)_3$ or any combination thereof.

The Co-containing film forming composition and one or more reactants may be introduced into the reaction chamber simultaneously (e.g., CVD), sequentially (e.g., ALD), or in other combinations. For example, the Co-containing film forming composition may be introduced in one pulse and two additional reactants may be introduced together in a separate pulse (e.g., modified ALD). Alternatively, the reaction chamber may already contain the reactant prior to introduction of the Co-containing film forming composition. The reactant may be passed through a plasma system localized or remotely from the reaction chamber, and decomposed to radicals. Alternatively, the Co-containing film forming composition may be introduced to the reaction chamber continuously while other reactants are introduced by pulse (e.g., pulsed-CVD). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s. In another alternative, the Co-containing film forming composition and one or more reactants may be simultaneously sprayed from a shower head under which a susceptor holding several wafers is spun (e.g., spatial ALD).

In one non-limiting exemplary ALD type process, the vapor phase of a Co-containing film forming composition is introduced into the reaction chamber, where at least part of the silylamine-containing precursor reacts with a suitable substrate, such as Si, $SiO_2$, $Al_2O_3$, etc., to form an adsorbed cobalt layer. Excess composition may then be removed from the reaction chamber by purging and/or evacuating the reaction chamber. An oxygen source is introduced into the reaction chamber where it reacts with the absorbed cobalt layer in a self-limiting manner. Any excess oxygen source is removed from the reaction chamber by purging and/or evacuating the reaction chamber. If the desired film is a cobalt oxide film, this two-step process may provide the desired film thickness or may be repeated until a film having the necessary thickness has been obtained.

Alternatively, if the desired film contains a second element (i.e., $CoMO_x$, wherein x may be 4 and M is Ta, Hf, Nb, Mg, Al, Sr, Y, Ba, Ca, As, Sb, Bi, Sn, Pb, Co, lanthanides (such as Er), or combinations thereof), the two-step process above may be followed by introduction of a vapor of a second precursor into the reaction chamber. The second precursor will be selected based on the nature of the oxide film being deposited. After introduction into the reaction chamber, the second precursor is contacted with the substrate. Any excess second precursor is removed from the reaction chamber by purging and/or evacuating the reaction chamber. Once again, an oxygen source may be introduced into the reaction chamber to react with the second precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the Co-containing film forming composition, second precursor, and oxygen source, a film of desired composition and thickness can be deposited.

Additionally, by varying the number of pulses, films having a desired stoichiometric M:Co ratio may be obtained. For example, a $CoMO_2$ film may be obtained by having one pulse of the Co-containing film forming composition and one pulses of the second precursor, with each pulse being followed by pulses of the oxygen source. However, one of ordinary skill in the art will recognize that the number of pulses required to obtain the desired film may not be identical to the stoichiometric ratio of the resulting film.

In another alternative, dense CoCN films may be deposited using an ALD method with hexachlorodisilane (HCDS) or pentachlorodisilane (PCDS), the disclosed Co-containing film forming composition, and an ammonia reactant. The reaction chamber may be controlled at 5 Torr, 550° C., with a 55 sccm continuous flow of Ar. An approximately 10 second long pulse of the Co-containing film forming composition at a flow rate of approximately 1 sccm is introduced into the reaction chamber. Any excess Co-containing film forming composition is purged from the reaction chamber with an approximately 55 sccm flow of Ar for approximately 30 seconds. An approximately 10 second pulse of HCDS at a flow rate of approximately 1 sccm is introduced into the reaction chamber. Any excess HCDS is purged from the reaction chamber with an approximately 55 sccm flow of Ar for approximately 30 seconds. An approximately 10 second long pulse of $NH_3$ at a flow rate of approximately 50 sccm is introduced into the reaction chamber. Any excess $NH_3$ is purged from the reaction chamber with an approximately 55 sccm flow of Ar for approximately 10 seconds. These 6 steps are repeated until the deposited layer achieves a suitable thickness. One of ordinary skill in the art will recognize that the introductory pulses may be simultaneous when using a spatial ALD device. The order of the introduction of the precursors may be varied and the deposition may be performed with or without the $NH_3$ reactant in order to tune the amounts of carbon and nitrogen in the SiCN film.

The cobalt-containing films resulting from the processes discussed above may include Co, $CoSi_2$, $CoO_2$, CoN, CoC, CoON, CoCN, CoCON, CoCOH, or $MCoO_x$, wherein M is an element such as Hf, Zr, Ti, Nb, Ta, or Ge, and x may be from 0-4, depending on the oxidation state of M. One of ordinary skill in the art will recognize that by judicial selection of the appropriate Co-containing film forming composition and reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the cobalt-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 600° C. for less than 3600 seconds under an H-containing atmosphere. The resulting film may contain fewer impurities and therefore may have improved performance characteristics. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the cobalt-containing film.

EXAMPLES

The following non-limiting examples are provided to further illustrate embodiments of the invention. However, the examples are not intended to be all inclusive and are not intended to limit the scope of the inventions described herein.

Example 1

Synthesis of Co[N(SiMe$_3$)$_2$]$_2$(THF)

A flask was filled with CoCl$_2$ (7.08 g) and THF (50 ml). NaN(SiMe$_3$)$_2$ THF solution (100 mL) was added dropwise at −78° C. and then the mixture warmed to room temperature (approximately 23° C., RT). After overnight reaction at RT, the solution was filtered through Celite™ brand diatomaceous earth and all solvent was removed under vacuum. The light green compound was purified by sublimation under vacuum (50 mTorr, 70~80° C.). Yield 58%. For XRD analysis, the product was recrystallized from hexane at −30° C. An air sensitive bright green crystal was obtained.

$^1$H NMR (δ, $C_6D_6$) −16.98 (s) 96.91 (brs), DSC 58° C. (melting point), 183° C. (decomposition), vapor pressure 1 Torr at 108° C.

Example 2

Synthesis of Co[N(SiMe$_2$Et)$_2$]$_2$(THF)

A flask was filled with CoCl$_2$ and THF. NaN(SiMe$_2$Et)$_2$ THF solution was added dropwise at −78° C. and then the mixture warmed to room temperature (approximately 23° C., RT). A deep green liquid was obtained.

$^1$H NMR (δ, $C_6D_6$) −34.69 (s), −19.67 (s) 2.11 (brs) 89.12 (brs), DSC 215° C. (decomposition), vapor pressure 1 Torr at 100° C.

Example 3

Synthesis of Co[N(SiMe$_3$)$_2$]$_2$(adduct)

10 equiv. of an adduct ligand (dried pyridine (py.), dimethylethylamine, diethylmethylamine, triethylamine, 1-methyl-pyrrolidine) were dropped into a hexane solution (5 mL) of Co[N(SiMe$_3$)$_2$]$_2$(THF) (1.0 g), prepared similar to that of Example 1, under nitrogen. After overnight reaction, solvent and excess adduct ligand was removed under vacuum. Crude product was extracted with dry hexane and filtered through a PTFE filter. The targeted compounds were purified by recrystallization from dry hexane at −30° C. and dried under vacuum at RT. Each adducted compound was isolated as a blue~green solid. The pyridine adduct (light blue, y.78%), Dimethylethylamine adduct (blue, y.87%), Diethylmethylamine adduct (Deep green, y.56%), Triethylamine adduct (Deep green, y.93%), 1-methyl-pyrrolidine adduct (light blue, y.86%).

Characterization of adducted compounds: Each compound was analyzed by $^1$H NMR and XRD.

Py adduct: $^1$H NMR (δ, $C_6D_6$) −18.84 (s) 67.04 (brs), 138.66 (brs), DSC 100° C. (m.p.), 216° C. (dec), vapor pressure 1 Torr at 153° C.

Dimethylethyl amine adduct $^1$H NMR (δ, $C_6D_6$) −24.91 (s) 71.77 (brs), DSC 88° C. (m.p.), 203° C. (dec), vapor pressure 1 Torr at 88° C.

Diethylmethyl amine adduct $^1$H NMR (δ, $C_6D_6$) −22.58 (brs), 59.40 (brs), 97.71 (brs) DSC 90° C. (m.p.), 210° C. (dec), vapor pressure 1 Torr at 82° C.

Triethyl amine adduct $^1$H NMR (δ, $C_6D_6$) −17.01 (s), 96.68 (brs), DSC 221° C. (dec), vapor pressure 1 Torr at 100° C.

1-Methyl-pyrrolidine adduct $^1$H NMR (δ, $C_6D_6$) −25.07 (s), 62.06 (brs), 76.22 (brs), DSC 148° C. (m.p.), 210° C. (dec), vapor pressure 1 Torr at 114° C.

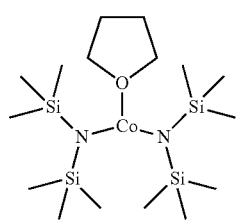

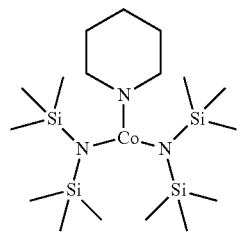

Co[N(SiMe$_3$)$_2$]$_2$(py)

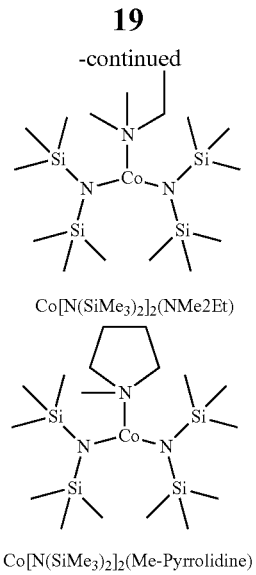

Co[N(SiMe₃)₂]₂(NMe2Et)

Co[N(SiMe₃)₂]₂(Me-Pyrrolidine)

Example 4

Synthesis of Co[N(SiMe₂Et)₂]₂(dimethylethylamine)

10 equiv. of dimethylethylamine was added dropwise to a hexane solution (5 mL) of Co[N(SiMe₂Et)₂]₂(THF) (1.0 g), prepared similar to that as in Example 2, under nitrogen. After overnight reaction, solvent and excess adduct ligand was removed under vacuum. Crude product was extracted with dry hexane and filtered through a PTFE filter. The targeted compounds were purified by distillation under vacuum (30 mTorr). Deep green liquid was obtained (y.45%). $^1$H NMR ($\delta$, $C_6D_6$) −20.45 (brs), −16.20 (S), 0.07 (s) 0.50 (q, J=8 Hz), 0.96 (t, J=8 Hz), 12.75 (brs) 94.02 (brs). DSC 124° C. (dec), vapor pressure of 1 Torr at 124° C.

Example 5

Thermal Analysis

Volatility was monitored by TGA (ThermoGravimetric Analysis, METTLER, TGA/SDTA851) under nitrogen (220 sccm). Temperature was increased by 10° C./min. Test sample was prepared under nitrogen in Aluminum pan. The results are shown in FIGS. 3 and 4.

Figure 3:
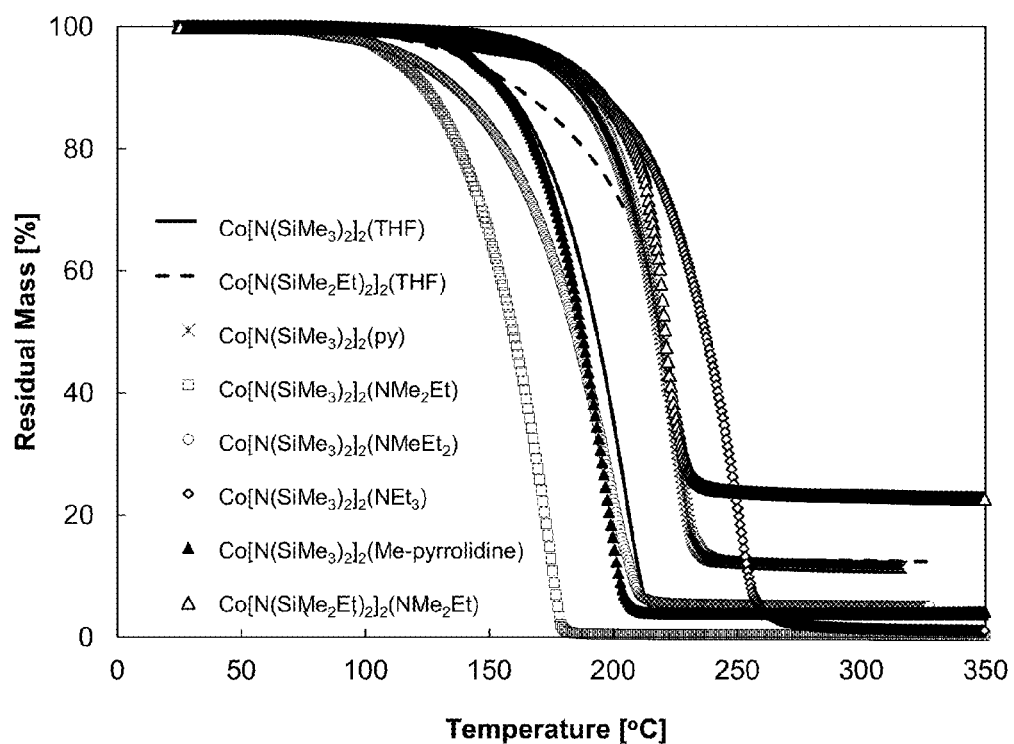
FIG. 3 is a comparative open cup Thermogravimetric Analysis (TGA) graph, under 1010 mbar, demonstrating the percentage of weight loss with increasing temperature of Co[N(SiMe$_3$)$_2$]$_2$(THF), Co[N(SiMe$_2$Et)$_2$]$_2$(THF), Co[N(SiMe$_3$)$_2$]$_2$(py), Co[N(SiMe$_3$)$_2$]$_2$(NMe$_2$Et), Co[N(SiMe$_3$)$_2$]$_2$(NMeEt$_2$), Co[N(SiMe$_3$)$_2$]$_2$(NEt$_3$), Co[N(SiMe$_3$)$_2$]$_2$(Me-pyrrolidine), and Co[N(SiMe$_2$Et)$_2$]$_2$(NMe$_2$Et)

FIG. 3 is a comparative open cup TGA graph of the Co[N(SiR$^1$R$^2$R$^3$)₂]₂(adduct) precursors with measurement under 1010 mbar.

Figure 4:
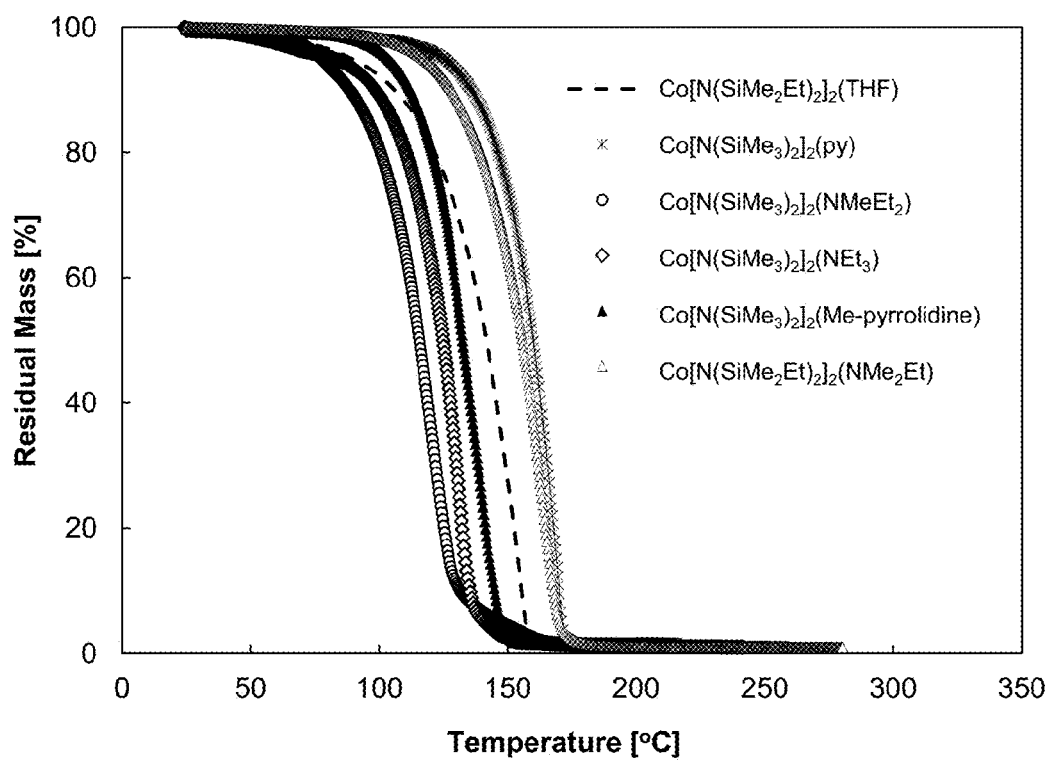
FIG. 4 is a comparative open cup TGA graph, under 20 mbar, demonstrating the percentage of weight loss with increasing temperature of Co[N(SiMe$_2$Et)$_2$]$_2$(THF), Co[N(SiMe$_3$)$_2$]$_2$(py), Co[N(SiMe$_3$)$_2$]$_2$(NMeEt$_2$), Co[N(SiMe$_3$)$_2$]$_2$(NEt$_3$), Co[N(SiMe$_3$)$_2$]$_2$(Me-pyrrolidine), and Co[N(SiMe$_2$Et)$_2$]$_2$(NMe$_2$Et)

FIG. 4 is a comparative open cup TGA graph of the Co[N(SiR$^1$R$^2$R$^3$)₂]₂(adduct) precursors with measurement under 20 mbar.

As can be seen, the Co[N(SiR$^1$R$^2$R$^3$)₂]₂(adduct) precursor family does not behave exhibit similar properties, notwithstanding the structural similarity of the precursors.

As for selection of precursor, volatility is important to be delivered to the reaction chamber. TGA data under atmospheric pressure tells which precursor is acceptable for use or not. Preferably, the precursor shows clear evaporation under vacuum.

Example 6

Thermal Stress Test

The samples were heated at temperatures which correspond to 1 Torr vapor pressure for 2 weeks ~3 months. The results are shown in FIGS. 5-9.

The stability of the precursor at usage temperature is also important. When a precursor is used, a canister is heated to give enough vapor, at least 1 Torr. To make high growth rate, the canister may be heated more than 1 Torr temperature. Hence a precursor must to be stable without decomposition to keep sending expected vapor.

Materials that are utilized in the semiconductor industry with a low vapor pressure, such as these compounds, must remain stable at elevated temperatures. The elevated temperatures have been selected to provide 1 Torr (133 Pa) vapor/partial pressure of the precursor in a canister as this pressure has been found to be adequate to provide an adequate dosage of material through the distribution system and into the process chamber. The canister may be kept at the elevated temperature for an extended duration that corresponds to the usage rate/productivity of the process tools (e.g., several weeks or several months). Materials that do not maintain their characteristics at such elevated temperatures may not be effectively utilized as precursors for semiconductor processing without additional exceptional equipment or conditioning. Applicants have surprisingly found that the NEtMe2 adduct of the Co(TMSA)₂ precursor has excellent thermal properties after extended high temperature exposure.

The material stability is not only dependent upon the volatility of the adduct. The NEtMe₂ adduct has a higher volatility than the NEt₂Me adduct, but exhibits significant degradation after three weeks. Additionally, as the precursor contains no oxygen, it may be useful in the deposition of pure Co films.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of depositing a Co-containing layer on a substrate, the method comprising introducing a vapor of a Co-containing film forming composition into a reactor having a substrate disposed therein, wherein the Co-containing film forming compositions comprises a silylamide-containing precursor selected from Co[N(SiMe₃)₂]₂(NMe₂Et), Co[N(SiMe₃)₂]₂(NMeEt₂), or combinations thereof; and depositing at least part of the silylamide-containing precursor onto the substrate to form the Co-containing layer using a vapor deposition method.

2. The method of claim 1, wherein the silylamide-containing precursor is Co[N(SiMe₃)₂]₂(NMe₂Et).

3. The method of claim 1, wherein the silylamide-containing precursor is Co[N(SiMe₃)₂]₂(NMeEt₂).

4. The method of claim 1, wherein the Co-containing layer is Co.

5. The method of claim 4, wherein the substrate is SiO₂.

6. The method of claim 4, wherein the substrate is Cu.

7. The method of claim 1, wherein the Co-containing layer is CoSi₂.

8. The method of claim 7, wherein the substrate is SiO₂.

9. The method of claim 7, wherein the substrate is Si.

10. A method of depositing a Co-containing layer on a substrate, the method comprising:
attaching a Co-containing film forming composition delivery device comprising a Co-containing film forming composition to a vapor deposition chamber, wherein the Co-containing film forming composition comprises a silylamide-containing precursor selected from Co[N(SiMe$_3$)$_2$]$_2$(NMe$_2$Et), Co[N(SiMe$_3$)$_2$]$_2$(NMeEt$_2$), or combinations thereof;

heating the Co-containing film forming composition delivery device to a temperature that generates between approximately 0.2 Torr (approximately 27 Pascal) and approximately 1.5 Torr (approximately 200 Pascal) of vapor pressure of the Co-containing film forming composition;

delivering a vapor of a Co-containing film forming composition into the vapor deposition chamber having a substrate disposed therein; and depositing at least part of the silylamide-containing precursor onto the substrate to form the Co-containing layer using a vapor deposition method.

11. The method of claim 10, wherein the silylamide-containing precursor is Co[N(SiMe$_3$)$_2$]$_2$(NMe$_2$Et).

12. The method of claim 11, wherein the Co-containing layer is Co.

13. The method of claim 12, wherein the substrate is SiO$_2$.

14. The method of claim 12, wherein the substrate is Cu.

15. The method of claim 11, wherein the Co-containing layer is CoSi$_2$.

16. The method of claim 15, wherein the substrate is SiO$_2$.

17. The method of claim 10, further comprising maintaining the Co-containing film forming composition delivery device at the temperature for 1 month.

18. The method of claim 17, wherein the silylamide-containing precursor is Co[N(SiMe$_3$)$_2$]$_2$(NMe$_2$Et).

19. The method of claim 10, further comprising maintaining the Co-containing film forming composition delivery device at the temperature for 2 months.

20. The method of claim 19, wherein the silylamide-containing precursor is Co[N(SiMe$_3$)$_2$]$_2$(NMe$_2$Et).

* * * * *